(12) United States Patent
Miyao et al.

(10) Patent No.: US 10,343,922 B2
(45) Date of Patent: Jul. 9, 2019

(54) POLYCRYSTALLINE SILICON ROD, PRODUCTION METHOD THEREFOR, AND FZ SILICON SINGLE CRYSTAL

(71) Applicant: Shin-Etsu Chemical Co., Ltd., Tokyo (JP)

(72) Inventors: Shuichi Miyao, Niigata (JP); Shigeyoshi Netsu, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 15/548,569

(22) PCT Filed: Dec. 10, 2015

(86) PCT No.: PCT/JP2015/006156
§ 371 (c)(1),
(2) Date: Aug. 3, 2017

(87) PCT Pub. No.: WO2016/132411
PCT Pub. Date: Aug. 25, 2016

(65) Prior Publication Data
US 2018/0002180 A1 Jan. 4, 2018

(30) Foreign Application Priority Data

Feb. 19, 2015 (JP) ................. 2015-030344

(51) Int. Cl.
*C01B 33/02* (2006.01)
*C01B 33/035* (2006.01)
(Continued)

(52) U.S. Cl.
CPC ............ *C01B 33/035* (2013.01); *C01B 33/02* (2013.01); *C23C 16/24* (2013.01); *C30B 13/00* (2013.01); *C30B 28/14* (2013.01); *C30B 29/06* (2013.01)

(58) Field of Classification Search
CPC ........ C01B 33/02; C01B 33/035; C23C 16/24; C30B 13/00; C30B 28/14; C30B 29/06
See application file for complete search history.

(56) References Cited

U.S. PATENT DOCUMENTS 6,221,155 B1 * 4/2001 Keck ...................... C23C 16/24
117/200
2008/0286550 A1 11/2008 Sofin et al.
(Continued)

FOREIGN PATENT DOCUMENTS

CN 101311351 A 11/2008
CN 201864575 U 6/2011
(Continued)

OTHER PUBLICATIONS

Office Action dated Jul. 25, 2017, issued in counterpart Japanese Application No. 2015-030344, with English machine translation. (15 pages).
(Continued)

*Primary Examiner* — Amber R Orlando
*Assistant Examiner* — Syed T Iqbal
(74) *Attorney, Agent, or Firm* — Westerman, Hattori, Daniels & Adrian, LLP

(57) ABSTRACT

A plate-shaped sample with a cross-section perpendicular to a radial direction of a polycrystalline silicon rod as a principal surface is sampled from a region from a center (r=0) of the polycrystalline silicon rod to R/3. Then, the sample is disposed at a position at which a Bragg reflection from a (111) Miller index plane is detected. In-plane rotation with a rotational angle φ on the sample is performed with a center of the sample as a rotational center such that an X-ray irradiation region defined by a slit performs φ-scanning on the principal surface of the sample to obtain a diffraction chart indicating dependency of a Bragg reflection intensity from the (111) Miller index plane on a rotational angle of the
(Continued)

sample. A ratio ($S_p/S_t$) between an area $S_p$ of a peak part appearing in the diffraction chart and a total area $S_t$ of the diffraction chart is calculated.

14 Claims, 9 Drawing Sheets

(51) Int. Cl.
*G01N 23/20* (2018.01)
*C30B 29/06* (2006.01)
*C23C 16/24* (2006.01)
*C30B 13/00* (2006.01)
*C30B 28/14* (2006.01)

(56) References Cited

U.S. PATENT DOCUMENTS

| | | |
|---|---|---|
| 2011/0014468 A1 | 1/2011 | Urushihara et al. |
| 2011/0052914 A1 | 3/2011 | Urushihara et al. |
| 2011/0229717 A1 | 9/2011 | Kraus |
| 2014/0033966 A1 | 2/2014 | Miyao et al. |
| 2014/0302239 A1* | 10/2014 | Kurosawa ............ C01B 33/035 427/255.393 |
| 2015/0003952 A1 | 1/2015 | Kurosawa et al. |
| 2015/0047554 A1 | 2/2015 | Miyao et al. |
| 2015/0107508 A1 | 4/2015 | Ishida et al. |
| 2015/0185167 A1 | 7/2015 | Miyao et al. |
| 2016/0116423 A1 | 4/2016 | Miyao et al. |

FOREIGN PATENT DOCUMENTS

| | | |
|---|---|---|
| CN | 104203819 A | 12/2014 |
| CN | 104220867 A | 12/2014 |
| EP | 2826748 A1 | 1/2015 |
| EP | 2835632 A1 | 2/2015 |
| EP | 3184489 A1 | 6/2017 |
| JP | 37-18861 B | 12/1962 |
| JP | 2008-285403 A | 11/2008 |
| JP | 2011-37699 A | 2/2011 |
| JP | 2011-68553 A | 4/2011 |
| JP | 2011-195441 A | 10/2011 |
| JP | 2013-112566 A | 6/2013 |
| JP | 2013-159504 A | 8/2013 |
| JP | 2013-217653 A | 10/2013 |
| JP | 2014-1096 A | 1/2014 |
| JP | 2014-31297 A | 2/2014 |
| JP | 2014-114184 A | 6/2014 |
| JP | 2015-3844 A | 1/2015 |
| WO | 2012/164803 A1 | 12/2012 |
| WO | WO-2013125208 A1 * | 8/2013 ........... C01B 33/035 |

OTHER PUBLICATIONS

Notice of Allowance dated Mar. 6, 2018, issued in counterpart Japanese Application No. 2015-030344, with English machine transaltion. (6 pages).

Extended (supplementary) European Search Report dated Jul. 20, 2018, issued in counterpart European Application No. 15882516.6. (7 pages).

International Search Report dated Feb. 9, 2016, issued in counterpart International Application No. PCT/JP2015/006156 (2 pages).

Written Opinion of International Search Authority dated Feb. 9, 2016, issued in counterpart International Application No. PCT/JP2015/006156 (2 pages).

Office Action dated Jan. 29, 2019, issued in counterpart Chinese Application No. 201580076377.8 (18 pages; w/ English machine translations).

* cited by examiner

10,343,922 B2

POLYCRYSTALLINE SILICON ROD, PRODUCTION METHOD THEREFOR, AND FZ SILICON SINGLE CRYSTAL

TECHNICAL FIELD

The present invention relates to an evaluation technology and a production technology of a polycrystalline silicon rod, and more specifically, relates to technologies to evaluate and produce a polycrystalline silicon rod suitable for a raw material for growth of an FZ silicon single crystal.

BACKGROUND ART

Single crystal silicon essential to production of semiconductor devices and the like is obtained by being caused to grow into a crystal by a CZ method or an FZ method. As a raw material therefor, a polycrystalline silicon rod or a polycrystalline silicon block is used. Such a polycrystalline silicon material is often produced by a Siemens method (see Patent Literature 1 and the like). The Siemens method is a method of bringing silane raw material gas such as trichlorosilane or a monosilane into contact with a heated silicon core wire, and thereby, performing gas-phase growth (deposition) of polycrystalline silicon on the surface of the silicon core wire by a CVD (Chemical Vapor Deposition) method.

For example, when obtaining single crystal silicon through crystal growth by the CZ method, a polycrystalline silicon block is charged into a quartz crucible, a seed crystal is immersed in silicon melt obtained by heating and melting this to make the dislocation line to disappear (make this dislocation free), and after that, the diameter is gradually enlarged to become a predetermined diameter to pull the crystal. In this stage, if unmolten polycrystalline silicon remains in the silicon melt, this causes these unmolten polycrystalline chips to drift close to the solid-liquid interface due to convection, and induces dislocation occurrence, which causes the crystal line to disappear.

Moreover, Patent Literature 2 points out a problem that needle crystals are sometimes deposited in a polycrystalline silicon rod in a step of producing the rod by a Siemens method, when causing single crystal silicon to grow using such a polycrystalline silicon rod by the FZ method, individual crystallites do not uniformly melt in accordance with their sizes due to the aforementioned uneven fine structure, unmolten crystallites pass through the melting zone as solid particles to reach the single crystal rod, and the unmolten crystallites are incorporated into the solidification surface of the single crystal as unmolten particles, which causes defects to be formed.

Furthermore, Patent Literature 3 discloses a technique for selecting a polycrystalline silicon suitable for a single crystal silicon production raw material with high quantitativity and high reproducibility based on the knowledge that crystal grains in a polycrystalline silicon rod are not necessarily in random orientation, the degree of crystal orientation (property of random orientation) depends on conditions in polycrystalline silicon deposition, when using a polycrystalline silicon rod or a polycrystalline silicon block with relatively high degree of crystal orientation (relatively low property of random orientation) as a production raw material for single crystal silicon, partial unmolten portions sometimes locally arise, and this induces occurrence of dislocation, which possibly causes the crystal line to disappear.

Patent Literature 3 specifically discloses a method of making polycrystalline silicon into a plate-shaped sample, disposing the plate-shaped sample at a position at which a Bragg reflection from an <hkl> Miller index plane is detected, performing in-plane rotation with a rotational angle $\phi$ with the center of the plate-shaped sample as the rotational center such that an X-ray irradiation region defined by a slit performs $\phi$-scanning on the principal surface of the plate-shaped sample to obtain a chart indicating dependency of the Bragg reflection intensity from a <111> or <220> Miller index plane on the rotational angle ($\phi$) of the plate-shaped sample, and evaluating the degree of crystal orientation of the polycrystalline silicon based on the number of peaks (with an S/N ratio of 3 or more) appearing in this chart.

Further, Patent Literature 3 reports an example that when the number of peaks appearing in the aforementioned $\phi$-scanning chart for a polycrystalline silicon rod is 24 quantity/cm$^2$ or less, which is obtained by conversion on a unit area basis of the plate-shaped sample, for any of the <111> and <220> Miller index planes, there is no case where disappearance of the crystal line caused by induction of dislocation occurrence arises in producing single crystal silicon with such a polycrystalline silicon rod as a raw material.

However, along with a larger-diameter single crystal silicon ingot in recent years, it is being requested that the diameter of a polycrystalline silicon rod which is its production raw material also be larger to have a diameter of approximately 130 mm or more.

CITATION LIST

Patent Literature

Patent Literature 1: Japanese Patent Publication No. 37-18861
Patent Literature 2: Japanese Patent Laid-Open No. 2008-285403
Patent Literature 3: Japanese Patent Laid-Open No. 2013-217653

SUMMARY OF INVENTION

Technical Problem

While Patent Literature 3 was reported by the inventors, after a further advance of inventors' study, it has been found that there is a case where disappearance of the crystal line arises in producing single crystal silicon even in the case where the aforementioned number of peaks from the (111) Miller index plane is 24 quantity/cm$^2$ or less when evaluating polycrystalline silicon rods, for example, having a diameter of 150 mm along with such a larger-diameter polycrystalline silicon rod.

The present invention is devised in view of such a problem, and an object thereof is to propose a novel technique of evaluating crystal orientation of a polycrystalline silicon rod having a diameter of 130 mm or more, with this technique, to select a large-diameter polycrystalline silicon rod suitable for a single crystal silicon production raw material, and thereby, to contribute stable production of single crystal silicon.

Solution to Problem

In order to solve the aforementioned problem, there is provided a polycrystalline silicon rod according to a first aspect of the present invention, obtained by being caused to grow through deposition by a chemical vapor deposition method and having a radius R of 65 mm or more, an area ratio $S_p/S_t$ which is evaluated through the following procedure by an X-ray diffraction method being 2% or less, the procedure including:

(1a) sampling a plate-shaped sample with a cross-section perpendicular to a radial direction of the polycrystalline silicon rod as a principal surface from a region from a center (r=0) of the polycrystalline silicon rod to R/3;

(1b) disposing the plate-shaped sample at a position at which a Bragg reflection from a (111) Miller index plane is detected;

(1c) performing in-plane rotation with a rotational angle ϕ on the plate-shaped sample with a center of the plate-shaped sample as a rotational center such that an X-ray irradiation region defined by a slit performs ϕ-scanning on the principal surface of the plate-shaped sample to obtain a diffraction chart indicating dependency of a Bragg reflection intensity from the (111) Miller index plane on a rotational angle of the plate-shaped sample; and (1d) calculating a ratio ($S_p/S_t$) between an area $S_p$ of a peak part appearing in the diffraction chart and a total area $S_t$ of the diffraction chart.

Moreover, there is provided a polycrystalline silicon rod according to a second aspect of the present invention, obtained by being caused to grow through deposition by a chemical vapor deposition method and having a radius R of 65 mm or more, an average value of area ratios $S_p/S_t$ which are evaluated through the following procedure by an X-ray diffraction method being 0.5% or less, the procedure including:

(2a) sampling at least one plate-shaped sample with a cross-section perpendicular to a radial direction of the polycrystalline silicon rod as a principal surface from each region of a first region from a center (r=0) of the polycrystalline silicon rod to r=R/3, a second region from r=R/3 to r=R/2, and a third region from r=R/2 to r=R;

(2b) disposing the plate-shaped sample at a position at which a Bragg reflection from a (111) Miller index plane is detected;

(2c) performing in-plane rotation with a rotational angle ϕ on the plate-shaped sample with a center of the plate-shaped sample as a rotational center such that an X-ray irradiation region defined by a slit performs ϕ-scanning on the principal surface of the plate-shaped sample to obtain a diffraction chart indicating dependency of a Bragg reflection intensity from the (111) Miller index plane on a rotational angle of the plate-shaped sample;

(2d) calculating a ratio ($S_p/S_t$) between an area $S_p$ of a peak part appearing in the diffraction chart and a total area $S_t$ of the diffraction chart; and (2e) calculating an average value of the area ratios $S_p/S_t$ for the plurality of plate-shaped samples.

Preferably, the peak part is defined to have an S/N ratio of 3 or more.

There is provided a production method for a polycrystalline silicon rod according to the present invention, being a production method for a polycrystalline silicon rod having a radius R of 65 mm of more by a chemical vapor deposition method, the production method comprising causing the polycrystalline silicon rod to grow under a condition set such that a feed gas amount is reduced by 2% or more in a second region from r=R/3 to r=R/2, and furthermore, the feed gas amount is reduced by 5% or more in a third region from r=R/2 to r=R in a deposition step of the polycrystalline silicon rod, where the feed gas amount at the start of deposition is set to be 100, and r=0 at a center of the polycrystalline silicon rod.

For example, the condition is set such that the feed gas amount is reduced by 2% to 5% in the second region from r=R/3 to r=R/2, and furthermore, the feed gas amount is reduced by 5% to 8% in the third region from r=R/2 to r=R.

An FZ silicon single crystal according to the present invention is an FZ silicon single crystal obtained by being caused to grow with the polycrystalline silicon rod as a raw material.

Advantageous Effects of Invention

The area ratio $S_p/S_t$ obtained through the aforementioned procedure is an index of the degree of crystal orientation. Accordingly, when evaluating a polycrystalline silicon rod with this area ratio $S_p/S_t$ used as a criterion, a polycrystalline silicon rod suitable for a raw material of growth of a silicon single crystal, in particular, an FZ silicon single crystal can be selected, partial unmolten portions can be suppressed from locally arising, and residual stress can be reduced, which can thereby contribute stable production of single crystal silicon.

BRIEF DESCRIPTION OF DRAWINGS

FIG. 5A shows one for a sample sampled from a region A (substantial center (r≈0) of the polycrystalline silicon rod).

FIG. 5B shows one for a sample sampled from a region B (r≈R/2).

FIG. 5C shows one for a sample sampled from a region C (r≈R).

DESCRIPTION OF EMBODIMENTS

Figure 1A:
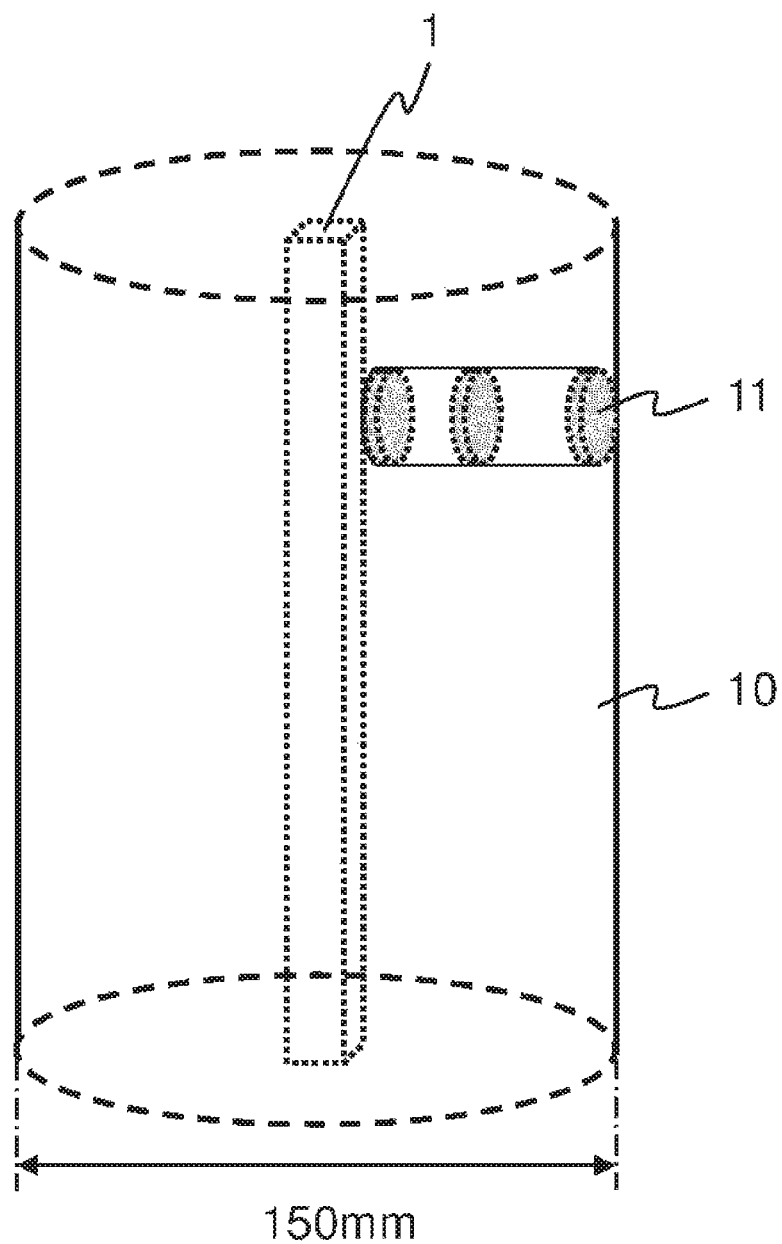
FIG. 1A is a diagram for explaining an example of sampling plate-shaped samples for X-ray diffraction measurement from a polycrystalline silicon rod obtained by being caused to grow through deposition by a chemical vapor deposition method.

Hereafter, an embodiment of the present invention is described with reference to the drawings.

During an advance of the study on crystal quality improvement of polycrystalline silicon rods for the purpose of stable production of FZ single crystal silicon having a large diameter of 130 mm or more, the inventors have found the knowledge that a difference in the degree of crystal orientation arises among polycrystalline silicon rods depending on conditions in deposition of polycrystalline silicon. As disclosed in Patent Literature 3, differently from single crystal silicon, a polycrystalline silicon block contains many crystal grains, and it tends to be thought that these many crystal grains are in random orientation. Nevertheless, according to inventors' study, the crystal grains contained in the polycrystalline silicon block are not necessarily in complete random orientation.

Further, as apparent from there being a case where, as mentioned above, disappearance of the crystal line arises in producing single crystal silicon even when the number of peaks from the (111) Miller index plane is 24 quantity/cm² or less in the case of a polycrystalline silicon rod, for example, having a diameter of 150 mm, more highly precise evaluation of the degree of crystal orientation is requested for a larger-diameter polycrystalline silicon rod.

According to inventors' experiments in use of polycrystalline silicon rods having diameters of 150 to 200 mm as FZ silicon single crystal formation raw materials, there has been found relation between the presence or absence of disappearance of the crystal habit line during the melting zone process and the crystal orientation of the polycrystalline silicon rod.

While in the method disclosed in Patent Literature 3, the number of peaks appearing in a φ-scanning chart is employed as the index of crystal orientation, in place of this in the present invention, a ratio ($S_p/S_t$) between an area $S_p$ of a peak part appearing in the diffraction chart and a total area $S_t$ of the diffraction chart is used as the index of crystal orientation, which thereby enables more highly precise evaluation of the degree of crystal orientation.

Specifically, targeting polycrystalline silicon rods obtained by being caused to grow through deposition by a chemical vapor deposition method and having a radius R of 65 mm or more (that is, a diameter of 130 mm or more), a polycrystalline silicon rod with an area ratio $S_p/S_t$ which is evaluated through the following procedure by an X-ray diffraction method being 2% or less is selected as a single crystal silicon production raw material, the procedure including:

(1a) sampling a plate-shaped sample with a cross-section perpendicular to a radial direction of the polycrystalline silicon rod as a principal surface from a region from a center (r=0) of the polycrystalline silicon rod to R/3;

(1b) disposing the plate-shaped sample at a position at which a Bragg reflection from a (111) Miller index plane is detected;

(1c) performing in-plane rotation with a rotational angle φ on the plate-shaped sample with a center of the plate-shaped sample as a rotational center such that an X-ray irradiation region defined by a slit performs φ-scanning on the principal surface of the plate-shaped sample to obtain a diffraction chart indicating dependency of a Bragg reflection intensity from the (111) Miller index plane on a rotational angle of the plate-shaped sample; and (1d) calculating a ratio ($S_p/S_t$) between an area $S_p$ of a peak part appearing in the diffraction chart and a total area $S_t$ of the diffraction chart.

For more highly precise evaluation, a polycrystalline silicon rod with an average value of area ratios $S_p/S_t$ which are evaluated through the following procedure by an X-ray diffraction method being 0.5% or less is selected as a single crystal silicon production raw material, the procedure including:

(2a) sampling at least one plate-shaped sample with a cross-section perpendicular to a radial direction of the polycrystalline silicon rod as a principal surface from each region of a first region from a center (r=0) of the polycrystalline silicon rod to r=R/3, a second region from r=R/3 to r=R/2, and a third region from r=R/2 to r=R;

(2b) disposing the plate-shaped sample at a position at which a Bragg reflection from a (111) Miller index plane is detected;

(2c) performing in-plane rotation with a rotational angle φ on the plate-shaped sample with a center of the plate-shaped sample as a rotational center such that an X-ray irradiation region defined by a slit performs φ-scanning on the principal surface of the plate-shaped sample to obtain a diffraction chart indicating dependency of a Bragg reflection intensity from the (111) Miller index plane on a rotational angle of the plate-shaped sample;

(2d) calculating a ratio ($S_p/S_t$) between an area $S_p$ of a peak part appearing in the diffraction chart and a total area $S_t$ of the diffraction chart; and (2e) calculating an average value of the area ratios $S_p/S_t$ for the plurality of plate-shaped samples.

According to inventors' study, the aforementioned area ratio ($S_p/S_t$) shows dependency on a site where the plate-shaped sample is sampled (distance from the center of the polycrystalline silicon rod). As general tendency of polycrystalline silicon rods having diameters of 130 mm or more, it shows the highest value immediately in the vicinity of the center part (silicon core wire), which value decreases as going more toward the surface side. Moreover, it has been confirmed that when using a polycrystalline silicon rod as an FZ single crystal formation raw material, the aforementioned area ratio ($S_p/S_t$) of the polycrystalline silicon rod that is used as the raw material when the crystal habit line disappears during the FZ process is relatively high.

Based on such results of the study, for the present invention, it has been contrived to select, as a single crystal silicon production raw material, a polycrystalline silicon rod with the area ratio $S_p/S_t$ being 2% or less, or with the average value of the area ratios $S_p/S_t$ being 0.5% or less.

Notably, the aforementioned peak part is preferably defined to have an S/N ratio of 3 or more.

The inventors think out the reason that the area $S_p$ (specifically, the area ratio $S_p/S_t$) of the peak part appearing in the diffraction chart indicating dependency of the Bragg reflection intensity from the (111) Miller index plane on the rotational angle of the plate-shaped sample can be the index of crystal orientation as follows.

A chemical vapor deposition method such as a Siemens method is a method of feeding hydrogen gas and trichlorosilane gas onto the surface of a silicon core wire which is red-heated at high temperature to deposit polycrystals thereon through the CVD reaction and to enlarge its diameter.

In this deposition process, a difference (ΔT) in temperature between the center part and the surface is almost negligible in the stage of its small diameter. Nevertheless, as the diameter becomes larger, ΔT gradually increases. Control of the surface temperature of the polycrystalline silicon rod is performed while controlling applied voltage and supplied current to the silicon core wire in order to attain the red-heated state at high temperature. In the stage of a large diameter, a difference ($\Delta I = I_c - I_s > 0$) between an amount ($I_c$) of the current flowing in the center part and an amount ($I_s$) of the current flowing in the surface region becomes larger.

The reason is that the surface of the polycrystalline silicon rod is always in the state where heat is removed by a hydrogen gas flow and a trichlorosilane gas flow. This means that in order to maintain the surface temperature of the polycrystalline silicon rod during the deposition process to be constant, the amount ($I_s$) of the current flowing in the surface region is needed to be gradually increased along with enlargement of the diameter. Hence, the amount ($I_c$) of the current flowing in the center part, which amount is in the relation of $I_c > I_s$, has to become higher.

According to inventors' study, along with a larger-diameter polycrystalline silicon rod, the phenomenon becomes more significant that during the CVD process, a region that has already crystallized partially melts, and after that, recrystallizes. Such recrystallization makes the degree of crystal orientation of the polycrystalline silicon rod finally obtained relatively high (property of random orientation relatively low). The aforementioned recrystallization is particularly significant for a polycrystalline silicon rod having a diameter 2R=130 mm or more, and it is found that the aforementioned partial melting and recrystallization due to the excess current tend to arise in a region from the center (r=0) of the polycrystalline silicon rod to R/3, which causes tendency that the degree of crystal orientation in the relevant region becomes high.

Therefore, for the present invention, it is contrived to sample a plate-shaped sample from a region from the center (r=0) of a polycrystalline silicon rod that is obtained by being caused to grow through deposition by a chemical vapor deposition method and has a radius R of 65 mm or more (diameter of 130 mm or more) to R/3 with a cross-section perpendicular to the radial direction of the polycrystalline silicon rod as a principal surface, and to evaluate its degree of crystal orientation by an X-ray diffraction method. As mentioned above, as the index of this degree of crystal orientation, the area $S_p$ (specifically, the area ratio $S_p/S_t$) of the peak part appearing in the diffraction chart indicating dependency of the Bragg reflection intensity from the (111) Miller index plane on the rotational angle of the plate-shaped sample is used.

The inventors have confirmed that when using, as a production raw material of an FZ silicon single crystal, a polycrystalline silicon rod in which a diffraction peak is found at a position corresponding to the (111) Miller index plane in a diffraction chart indicating dependency on the rotational angle of a plate-shaped sample, this tends to result in disappearance of the crystal habit line. The reason is thought to be that a polycrystalline silicon rod relatively high in the degree of crystal orientation tends to afford partial unmolten portions during the zone melting process, which disturbs the equilibrium state at the solid-liquid interface.

Figure 1B:
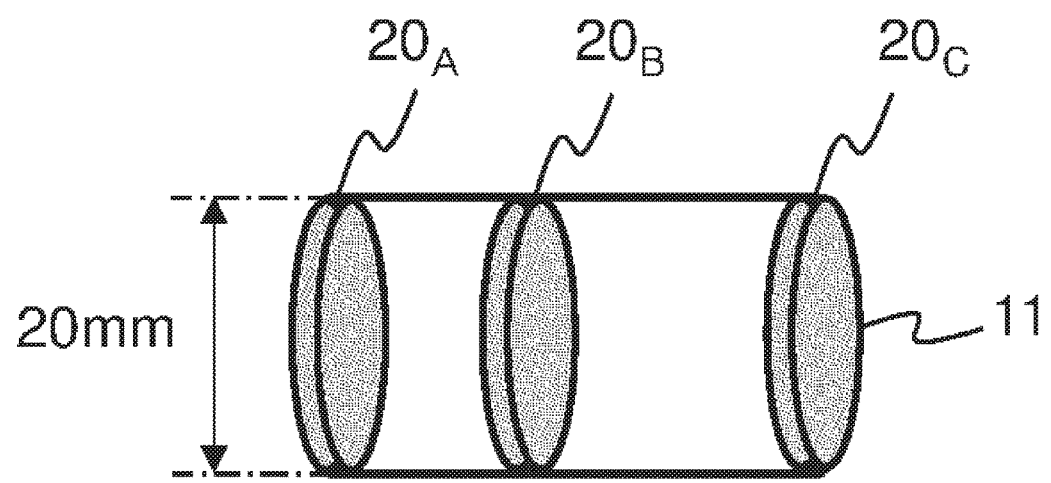
FIG. 1B is a diagram for explaining an example of sampling plate-shaped samples for X-ray diffraction measurement from a polycrystalline silicon rod obtained by being caused to grow through deposition by a chemical vapor deposition method.

FIG. 1A and FIG. 1B are diagrams for explaining an example of sampling plate-shaped samples 20 for X-ray diffraction profile measurement from a polycrystalline silicon rod 10 obtained by being caused to grow through deposition by a chemical vapor deposition method such as a Siemens method. In the figure, reference numeral 1 designates a silicon core wire for depositing polycrystalline silicon on its surface to afford the silicon rod. Notably, in this example, in order to examine the presence or absence of radial directional dependency of the degree of crystal orientation in the polycrystalline silicon rod, the plate-shaped samples 20 are sampled from three regions (a region A: a first region from the center (r=0) of the polycrystalline silicon rod to r=R/3, a region B: a second region from r=R/3 to r=R/2, and a region C: a third region from r=R/2 to r=R).

The diameter of the polycrystalline silicon rod 10 exemplarily shown in FIG. 1A is approximately 150 mm. This polycrystalline silicon rod 10 is hollowed out from its lateral surface side perpendicularly to the longitudinal direction of the silicon core wire 1 to afford a rod 11 with a diameter of approximately 20 mm and a length of approximately 75 mm.

Then, as shown in FIG. 1B, the plate-shaped samples ($20_A$, $20_B$ and $20_C$) the principal surface of each of which is a cross-section perpendicular to the radial direction of the polycrystalline silicon rod 10 and the thickness of each of which is approximately 2 mm are respectively sampled from a site (region A), in the rod 11, close to the silicon core wire 1, a region (region B) from r=R/3 to r=R/2 of the polycrystalline silicon rod, and a site (region C) close to the lateral surface of the polycrystalline silicon rod 10.

Notably, the site from which the rod 11 is sampled, the length of the rod 11, and the number of the rods 11 only have to be properly determined in accordance with the diameter of the silicon rod 10 and the diameter of the rod 11 obtained by hollowing-out. While the plate-shaped samples 20 may be sampled from any sites in the rod 11 obtained by hollowing-out, the sites are preferably positions where the nature of the whole silicon rod 10 can be rationally estimated. In the present invention, at least from the region from the center (r=0) of the polycrystalline silicon rod to R/3, a plate-shaped sample is sampled.

Moreover, while in the aforementioned example, one plate-shaped sample 20 is sampled from each of the three regions (the region A: the first region from the center (r=0) of the polycrystalline silicon rod to r=R/3, the region B: the second region from r=R/3 to r=R/2, and the region C: the third region from r=R/2 to r=R), if a plurality of plate-shaped samples 20 are sampled, the degree of crystal orientation can be more precisely evaluated. Notably, as mentioned above, in the present invention, at least from the aforementioned region A (first region from the center (r=0) of the polycrystalline silicon rod to r=R/3), a plate-shaped sample is definitely sampled.

Furthermore, to set the diameter of the plate-shaped sample 20 to be approximately 20 mm is merely exemplary, and the diameter thereof only has to be properly determined so as not to cause a problem in X-ray diffraction measurement.

Figure 2:
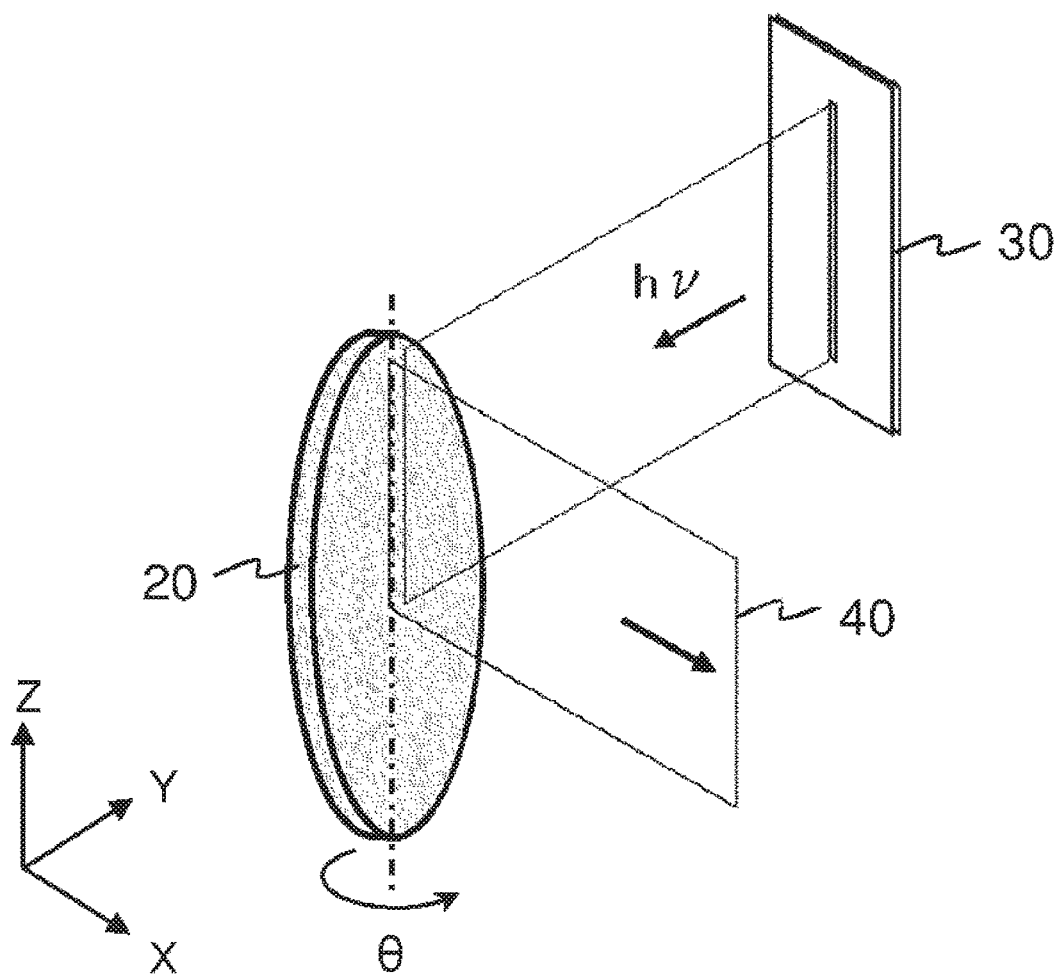
FIG. 2 is a diagram for schematically explaining an example of a measurement system when obtaining an X-ray diffraction profile from the plate-shaped sample by a so-called θ-2θ method.

FIG. 2 is a diagram for schematically explaining an example of a measurement system when obtaining an X-ray diffraction profile from the plate-shaped sample 20 by a so-called θ-2θ method. An X-ray beam 40 (Cu-Kα line: 1.54 Å of wavelength) which is emitted from a slit 30 and collimated enters the plate-shaped sample 20. The intensity of the diffracted X-ray beam is detected by a detector (not shown) for each sample rotational angle (θ) while rotating the plate-shaped sample 20 in the XY-plane to obtain an X-ray diffraction chart of θ-2θ.

Figure 3:
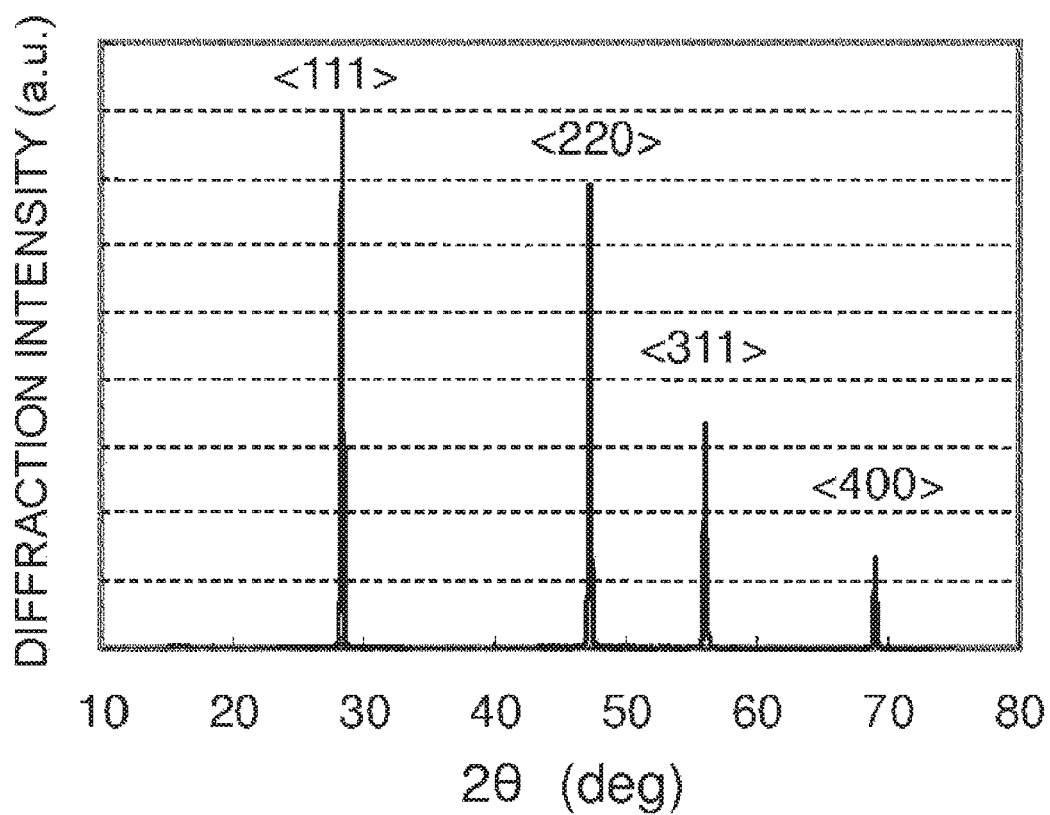
FIG. 3 is an example of an X-ray diffraction chart of θ-2θ.

FIG. 3 is an example of the X-ray diffraction chart of θ-2θ obtained above. In the chart, strong Bragg reflections from <111>, <220>, <311> and <400> Miller index planes appear as peaks at the positions with 2θ=28.40°, 47.24°, 55.98° and 68.98°, respectively.

Figure 4:
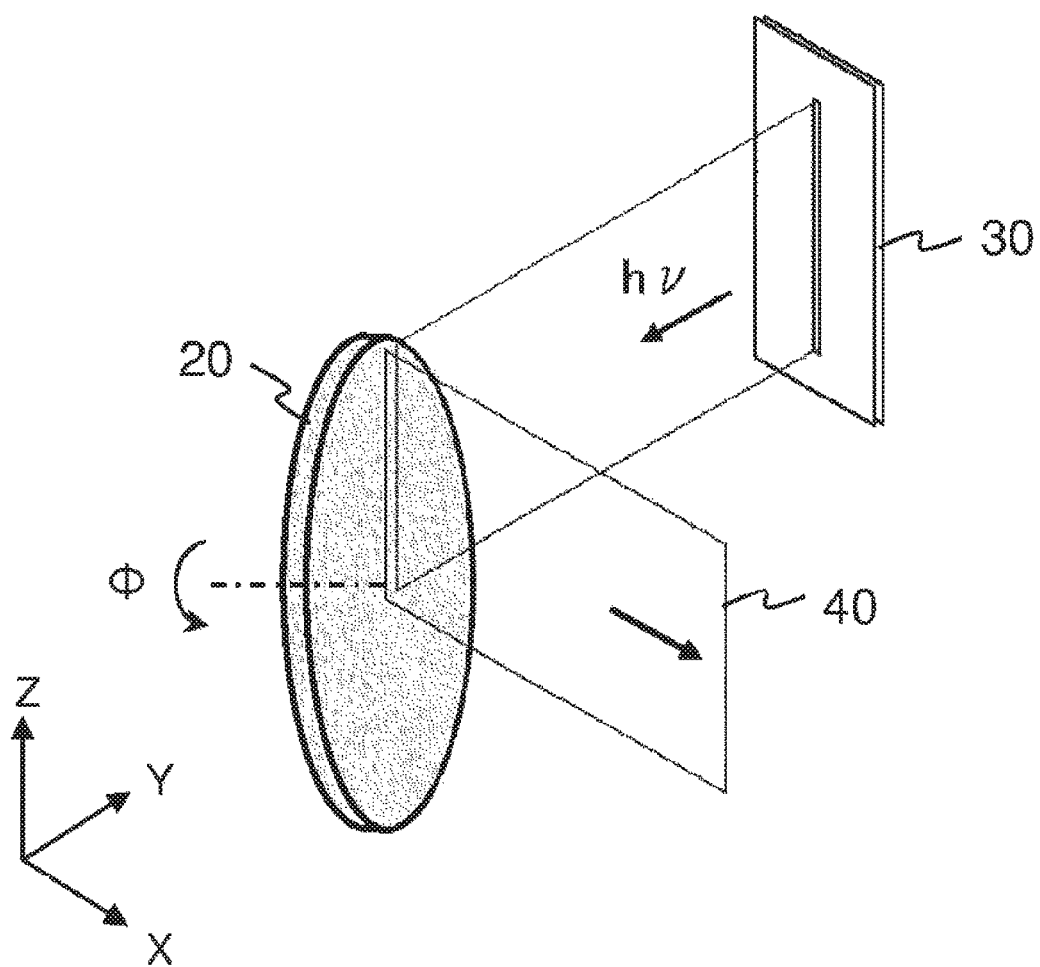
FIG. 4 is a diagram for schematically explaining an example of a measurement system when obtaining an X-ray diffraction profile from the plate-shaped sample by a so-called ϕ-scanning method.

FIG. 4 is a diagram for schematically explaining a measurement system when obtaining an X-ray diffraction profile from the plate-shaped sample 20 by a so-called ϕ-scanning method. For example, θ of the plate-shaped sample 20 above is set to be the angle at which the Bragg reflection from the (111) Miller index plane is detected, in this state, an X-ray is radiated onto a thin rectangular region defined by a slit in a region across from the center to the circumferential end of the plate-shaped sample 20, and the plate-shaped sample 20 is rotated (ϕ=0° to 360°) in the YZ-plane with the center of the plate-shaped sample 20 as the rotational center such that this X-ray irradiation region scans the whole surface of the plate-shaped sample 20.

Figure 5A:
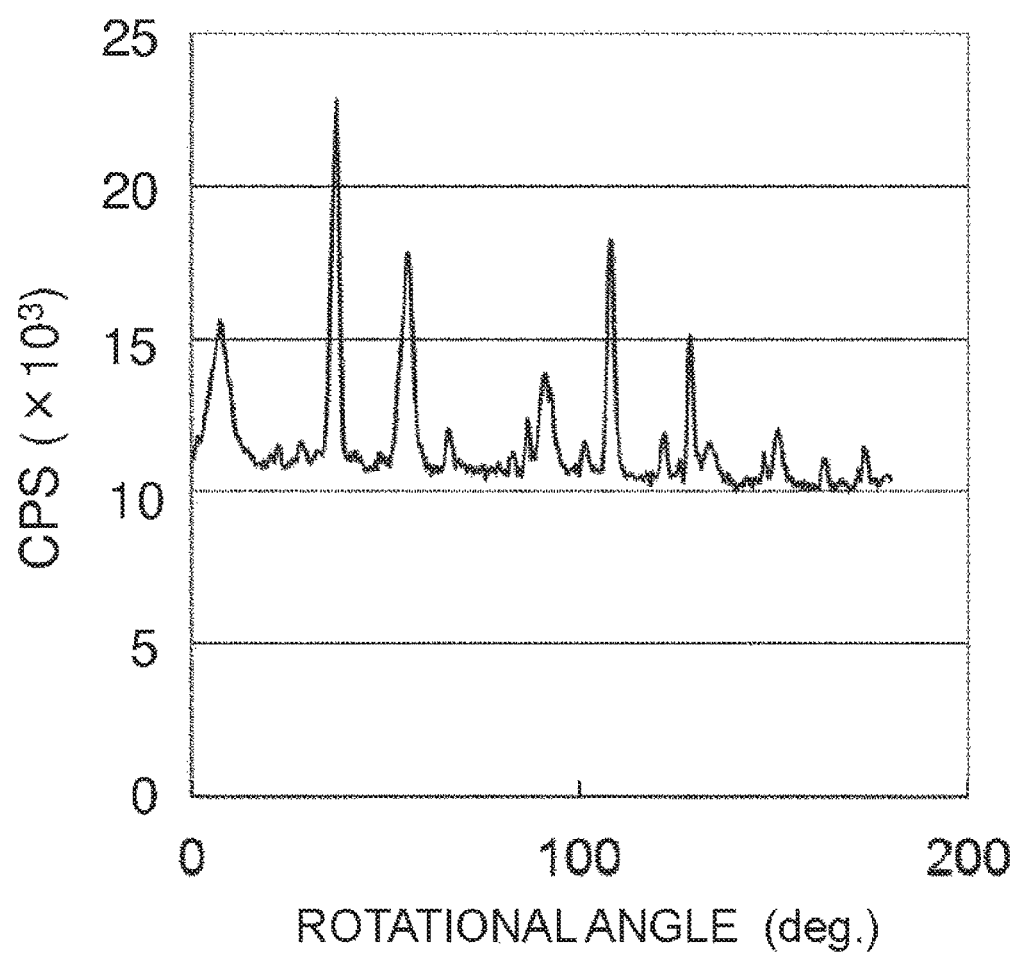
FIG. 5A is an example of a ϕ-scanning diffraction chart obtained from a plate-shaped sample sampled from a polycrystalline silicon rod in which disappearance of the crystal habit line arises when using the polycrystalline silicon rod as a production raw material of an FZ silicon single crystal.
Figure 5B:
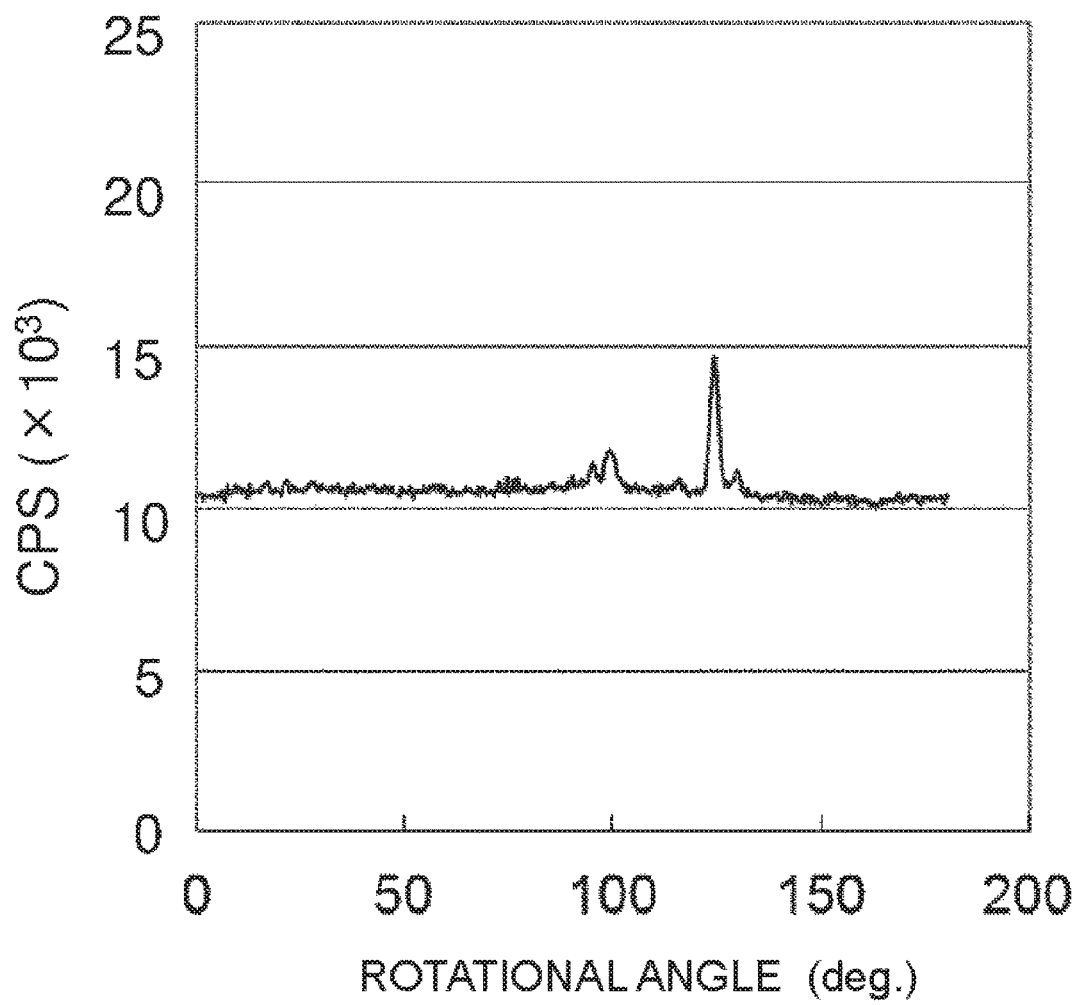
FIG. 5B is an example of a ϕ-scanning diffraction chart obtained from a plate-shaped sample sampled from the polycrystalline silicon rod in which disappearance of the crystal habit line arises when using the polycrystalline silicon rod as the production raw material of the FZ silicon single crystal.
Figure 5C:
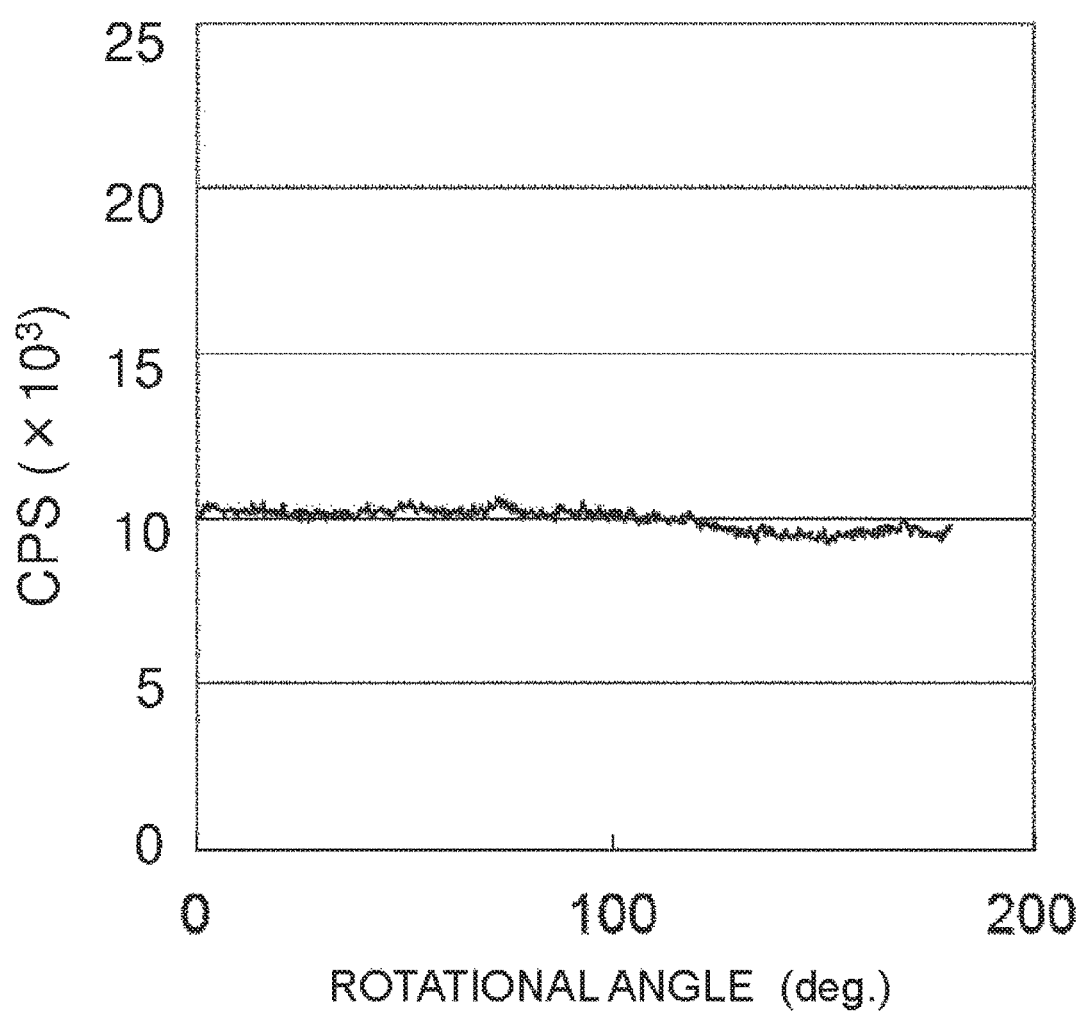
FIG. 5C is an example of a ϕ-scanning diffraction chart obtained from a plate-shaped sample sampled from the polycrystalline silicon rod in which disappearance of the crystal habit line arises when using the polycrystalline silicon rod as the production raw material of the FZ silicon single crystal.

FIGS. 5A to 5C are ϕ-scanning diffraction charts obtained from plate-shaped samples sampled from a polycrystalline silicon rod in which disappearance of the crystal habit line arises when using the polycrystalline silicon rod as a production raw material of an FZ silicon single crystal. A sample A shown in FIG. 5A, a sample B shown in FIG. 5B and a sample C shown in FIG. 5C are respectively sampled from the region A (substantial center (r≈0) of the polycrystalline silicon rod), the region B (r≈R/2) and the region C (r≈R). From each of these diffraction charts, a ratio ($S_p/S_t$) between an area $S_p$ of a (111) diffraction peak part and a total area $S_t$ of the diffraction chart is calculated for each of the plate-shaped samples.

As a result, $S_p/S_t$=11.2% for the sample A, $S_p/S_t$=1% for the sample B, and $S_p/S_t$=0% for the sample C. The $S_p/S_t$ ratio increases as the sample is sampled from the region closer to center of the polycrystalline silicon rod, and the $S_p/S_t$ ratio decreases as the sample is sampled from the region closer to the surface thereof.

Figure 6:
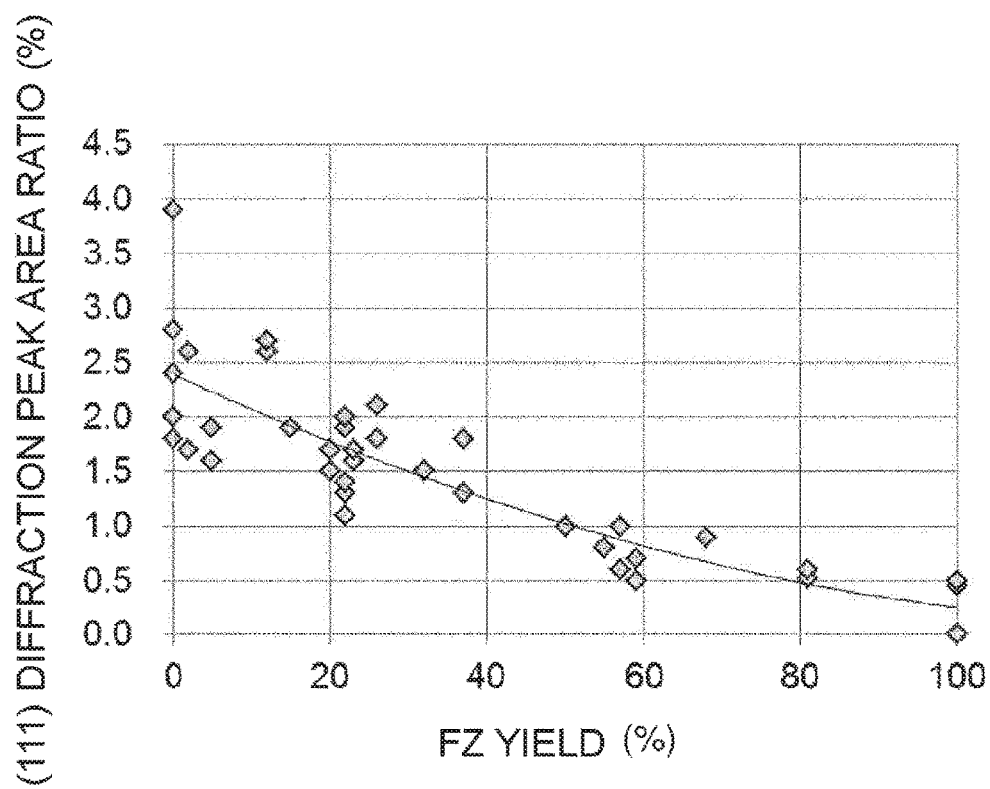
FIG. 6 is a diagram obtained by collecting data that were obtained by using 40 polycrystalline silicon rods for relation between FZ yields (%) and area ratios ($S_p/S_t$) of a (111) diffraction peak part.

FIG. 6 is a diagram obtained by collecting data that were obtained by using 40 polycrystalline silicon rods for relation between the aforementioned FZ yields (%) and the area ratios ($S_p/S_t$) of the (111) diffraction peak part. Specifically, correlation between the yields of FZ silicon single crystal formation (total length ratios (%) of the length of the region in which disappearance of the crystal habit line was not found) and the aforementioned area ratios ($S_p/S_t$) with these polycrystalline silicon rods used as production raw materials of FZ silicon single crystals was studied. Statistically processing these results, a correlation coefficient r0 is 0.862. Statistically examining the significance of the correlation coefficient, $$r=0.862**>>r0(38,0.01)=0.402$$

and with the decision condition of 1% of critical rate, it is determined "highly significant correlation is found". In the case of 5% of critical rate, r0(38,0.05)=0.314. The reference value r0 of the decision is a value determined based on the degree of freedom and the critical rate, and the degree of freedom is the data number-2 which is 40−2=38 in this case.

From the results shown in this figure, it is clearly understood that the degree of disappearance of the crystal habit line in the case of using these polycrystalline silicon rods as the production raw materials of the FZ silicon single crystals is higher as the aforementioned $S_p/S_t$ ratio is larger (as the peak area ratio from the (111) Miller index plane is higher).

Notably, when calculating the aforementioned $S_p/S_t$ ratio, intensity calculation (area calculation) of the peak from the (111) Miller index plane is needed. Therefore, first, an average value $I_a$ of all the diffraction intensities appearing in the diffraction chart was calculated, a baseline $I_b$ of the chart was read from the chart, and the value of $(I_a-I_b)/I_b \times 100$ was employed.

The inventors accumulated evaluation results of the degrees of crystal orientation of polycrystalline silicon rods by the aforementioned technique, and advanced the study on the growth conditions, of a polycrystalline silicon rod, under which the aforementioned (111) diffraction peak was caused not to arise.

In order not to cause the aforementioned (111) diffraction peak to arise, it is important to limit the current flowing in the near-center region of a polycrystalline silicon rod, and meanwhile, to control the temperature of the outer surface to be constant during the CVD process.

The inventors thought, to this end, that it was important to reduce the amount of heat removed from the surface along with a gas flow, and contrived to set the total amount of feed gas (sum total of the hydrogen gas amount and the trichlorosilane gas amount) to be lower than conventional one without changing the concentration of trichlorosilane in the feed gas.

With such raw material gas feed, since the amount of fed trichlorosilane decreases, the growth speed decreases by the amount of this decrease. Nevertheless, from repeated experiments by the inventors, it was found that productivity itself of silicon single crystals did not deteriorate by the (111) diffraction peak caused not to arise since the yields of FZ silicon single crystal formation in the case of using such polycrystalline silicon rods as raw materials were dramatically improved.

EXAMPLES

Six polycrystalline silicon rods (A to F) which were caused to grow under different deposition conditions and had a diameter of approximately 140 mm were prepared. For each of these polycrystalline silicon rods, the plate-shaped samples ($20_A$, $20_B$ and $20_C$) whose thickness was approximately 2 mm were sampled from the three sites shown in FIGS. 1A and 1B to obtain ϕ-scanning charts of their (111) Miller index planes with the measurement system shown in FIG. 4. Notably, the diameter of the plate-shaped sample 20 was approximately 20 mm.

The polycrystalline silicon rods A to C were caused to grow under the conditions set such that the feed gas amount was maintained to be still 100 in the first region from the center (r=0) of the polycrystalline silicon rod to r=R/3, reduced by 2% to 5% in the second region from r=R/3 to r=R/2, and furthermore, reduced by 5% to 8% in the third region from r=R/2 to r=R, where the feed gas amount at the start of deposition was set to be 100.

On the contrary, the polycrystalline silicon rods D to F were caused to grow under the conditions set such that the feed gas amount was maintained to be still 100 in the first region from the center (r=0) of the polycrystalline silicon rod to r=R/3, reduced by 0.2% to 1% in the second region from r=R/3 to r=R/2, and furthermore, reduced by 0.5% to 3% in the third region from r=R/2 to r=R, where the feed gas amount at the start of deposition was set to be 100.

There are collected in Table 1 a (111) diffraction peak area ratio (%) of the sample sampled from the first region, an average (%) of the (111) diffraction peak area ratios of the samples sampled from the first to third regions, reducing rates (%) of the feed gas amount, the presence or absence of residual stress in polycrystalline silicon, and a yield of FZ silicon single crystal formation in the case of using each of these polycrystalline silicon rods as a raw material (total length ratio (%) of the region length in which disappearance of the crystal habit line was not found), these measured using the aforementioned plate-shaped samples.

TABLE 1

|  |  | Examples | | | Comparative Examples | | |
|---|---|---|---|---|---|---|---|
| Polycrystalline Silicon Rod | | A | B | C | D | E | F |
| Diameter (mm) | | 140 | 142 | 140 | 141 | 142 | 140 |
| (111) Peak Area Ratio (%) | $r = 0$ to $R/3$ | 0 | 0 | 1.9 | 2.8 | 5.9 | 7.9 |
| | Average for Three Regions | 0 | 0 | 0.5 | 0.9 | 1.4 | 2.7 |
| Feed Gas Reducing Rate (%) | $r = R/3$ to $R/2$ | 5 | 3 | 2 | 1 | 0.5 | 0.2 |
| | $r = R/2$ to $R$ | 8 | 6 | 5 | 3 | 1 | 0.5 |
| Residual Stress | Compressive | Present | Present | Present | Present | Present | Present |
| | Tensile | Absent | Absent | Absent | Present | Present | Present |
| FZ Yield (%) | | 100 | 100 | 100 | 68 | 22 | 12 |

As presented in Table 1, as compared with the polycrystalline silicon rods (D to F), the polycrystalline silicon rods (A to C) with which disappearance of the crystal habit line was not found have smaller (111) diffraction peak area ratios. Moreover, while in the polycrystalline silicon rods (A to C), tensile stress is not found although compressive stress is found, in the polycrystalline silicon rods (D to F), both compressive stress and tensile stress are found.

According to these results, it is preferable to cause a polycrystalline silicon rod to grow under the conditions set such that the feed gas amount is reduced by 2% or more in the second region from $r=R/3$ to $r=R/2$, and furthermore, reduced by 5% or more in the third region from $r=R/2$ to $r=R$ in the deposition step of the polycrystalline silicon rod, where the feed gas amount at the start of deposition is set to be 100. For example, a polycrystalline silicon rod is caused to grow under the conditions set such that the feed gas amount is reduced by 2% to 5% in the second region from $r=R/3$ to $r=R/2$, and furthermore, reduced by 5% to 8% in the third region from $r=R/2$ to $r=R$, where the feed gas amount at the start of deposition is set to be 100.

INDUSTRIAL APPLICABILITY

The present invention proposes a novel technique to evaluate crystal orientation of a polycrystalline silicon rod having a diameter of 130 mm or more. Further, a large-diameter polycrystalline silicon rod suitable for a single crystal silicon production raw material is selected with this technique, which thereby contributes stable production of single crystal silicon.

REFERENCE SIGNS LIST

1 Silicon core wire
10 Polycrystalline silicon rod
11 Rod
20 Plate-shaped sample
30 Slit
40 X-ray beam

The invention claimed is:
1. A production method for a polycrystalline silicon rod having a radius R of 65 mm or more by a chemical vapor deposition method, the production method comprising:
   causing the polycrystalline silicon rod to grow under a condition set such that a feed gas amount is reduced by 2% or more in a second region from $r=R/3$ to $r=R/2$, and furthermore, the feed gas amount is reduced by 5% or more in a third region from $r=R/2$ to $r=R$ in a deposition step of the polycrystalline silicon rod, where the feed gas amount at the start of deposition is set to be 100, and $r=0$ at a center of the polycrystalline silicon rod.

2. A polycrystalline silicon rod produced by the method according to claim 1, wherein
   an area ratio $S_p/S_t$ of the polycrystalline silicon rod is 2% or less, the area ratio $S_p/S_t$ being measured by an X-ray diffraction method comprising:
   (1a) sampling a plate-shaped sample with a cross-section perpendicular to a radial direction of the polycrystalline silicon rod as a principal surface from a region extending from a center ($r=0$) of the polycrystalline silicon rod to $R/3$;
   (1b) disposing the plate-shaped sample at a position at which a Bragg reflection from a (111) Miller index plane is detected;
   (1c) performing in-plane rotation with a rotational angle $\varphi$ on the plate-shaped sample with a center of the plate-shaped sample as a rotational center such that an X-ray irradiation region defined by a slit performs $\varphi$-scanning on the principal surface of the plate-shaped sample to obtain a diffraction chart indicating dependency of a Bragg reflection intensity from the (111) Miller index plane on a rotational angle of the plate-shaped sample; and
   (1d) calculating a ratio ($S_p/S_t$) between an area $S_p$ of a peak part appearing in the diffraction chart and a total area $S_t$ of the diffraction chart.

3. The polycrystalline silicon rod according to claim 2, wherein the peak part is defined to have an S/N ratio of 3 or more.

4. An FZ silicon single crystal obtained by being caused to grow with the polycrystalline silicon rod according to claim 2 as a raw material.

5. A polycrystalline silicon rod produced by the method according to claim 1, wherein
   an average value of area ratios $S_p/S_t$ of the polycrystalline silicon rod is 0.5% or less, the average value of area ratios $S_p/S_t$ being measured by an X-ray diffraction method comprising:
   (2a) sampling at least one plate-shaped sample with a cross-section perpendicular to a radial direction of the polycrystalline silicon rod as a principal surface from each region of a first region extending from a center ($r=0$) of the polycrystalline silicon rod to $r=R/3$, a second region extending from $r=R/3$ to $r=R/2$, and a third region extending from $r=R/2$ to $r=R$;

(2b) disposing the plate-shaped sample at a position at which a Bragg reflection from a (111) Miller index plane is detected;

(2c) performing in-plane rotation with a rotational angle φ on the plate-shaped sample with a center of the plate-shaped sample as a rotational center such that an X-ray irradiation region defined by a slit performs φ-scanning on the principal surface of the plate-shaped sample to obtain a diffraction chart indicating dependency of a Bragg reflection intensity from the (111) Miller index plane on a rotational angle of the plate-shaped sample;

(2d) calculating a ratio ($S_p/S_t$) between an area $S_p$ of a peak part appearing in the diffraction chart and a total area $S_t$ of the diffraction chart; and (2e) calculating an average value of the area ratios $S_p/S_t$ for the plurality of plate-shaped samples.

6. The polycrystalline silicon rod according to claim 5, wherein the peak part is defined to have an S/N ratio of 3 or more.

7. An FZ silicon single crystal obtained by being caused to grow with the polycrystalline silicon rod according to claim 5 as a raw material.

8. The production method for a polycrystalline silicon rod according to claim 7, wherein the condition is set such that the feed gas amount is reduced by 2% to 5% in the second region from r=R/3 to r=R/2, and furthermore, the feed gas amount is reduced by 5% to 8% in the third region from r=R/2 to r=R.

9. A polycrystalline silicon rod produced by the method according to claim 8, wherein an area ratio $S_p/S_t$ of the polycrystalline silicon rod is 2% or less, the area ratio $S_p/S_t$ being measured by an X-ray diffraction method being:

(1a) sampling a plate-shaped sample with a cross-section perpendicular to a radial direction of the polycrystalline silicon rod as a principal surface from a region extending from a center (r=0) of the polycrystalline silicon rod to R/3;

(1b) disposing the plate-shaped sample at a position at which a Bragg reflection from a (111) Miller index plane is detected;

(1c) performing in-plane rotation with a rotational angle φ on the plate-shaped sample with a center of the plate-shaped sample as a rotational center such that an X-ray irradiation region defined by a slit performs φ-scanning on the principal surface of the plate-shaped sample to obtain a diffraction chart indicating dependency of a Bragg reflection intensity from the (111) Miller index plane on a rotational angle of the plate-shaped sample; and (1d) calculating a ratio ($S_p/S_t$) between an area $S_p$ of a peak part appearing in the diffraction chart and a total area $S_t$ of the diffraction chart.

10. The polycrystalline silicon rod according to claim 9, wherein the peak part is defined to have an S/N ratio of 3 or more.

11. An FZ silicon single crystal obtained by being caused to grow with the polycrystalline silicon rod according to claim 9 as a raw material.

12. A polycrystalline silicon rod produced by the method according to claim 8, wherein an average value of area ratios $S_p/S_t$ of the polycrystalline silicon rod is 0.5% or less, the average value of area ratios $S_p/S_t$ being measured by an X-ray diffraction method comprising:

(2a) sampling at least one plate-shaped sample with a cross-section perpendicular to a radial direction of the polycrystalline silicon rod as a principal surface from each region of a first region extending from a center (r=0) of the polycrystalline silicon rod to r=R/3, a second region extending from r=R/3 to r=R/2, and a third region extending from r=R/2 to r=R;

(2b) disposing the plate-shaped sample at a position at which a Bragg reflection from a (111) Miller index plane is detected;

(2c) performing in-plane rotation with a rotational angle φ on the plate-shaped sample with a center of the plate-shaped sample as a rotational center such that an X-ray irradiation region defined by a slit performs φ-scanning on the principal surface of the plate-shaped sample to obtain a diffraction chart indicating dependency of a Bragg reflection intensity from the (111) Miller index plane on a rotational angle of the plate-shaped sample;

(2d) calculating a ratio ($S_p/S_t$) between an area $S_p$ of a peak part appearing in the diffraction chart and a total area $S_t$ of the diffraction chart; and (2e) calculating an average value of the area ratios $S_p/S_t$ for the plurality of plate-shaped samples.

13. The polycrystalline silicon rod according to claim 12, wherein the peak part is defined to have an S/N ratio of 3 or more.

14. An FZ silicon single crystal obtained by being caused to grow with the polycrystalline silicon rod according to claim 12 as a raw material.

* * * * *